(12) United States Patent
Winstead et al.

(10) Patent No.: US 7,811,886 B2
(45) Date of Patent: Oct. 12, 2010

(54) SPLIT-GATE THIN FILM STORAGE NVM CELL WITH REDUCED LOAD-UP/TRAP-UP EFFECTS

(75) Inventors: Brian A. Winstead, Austin, TX (US); Taras A. Kirichenko, Austin, TX (US); Konstantin V. Loiko, Austin, TX (US); Ramachandran Muralidhar, Austin, TX (US); Rajesh A. Rao, Austin, TX (US); Sung-Taeg Kang, Austin, TX (US); Ko-Min Chang, Austin, TX (US); Jane Yater, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 726 days.

(21) Appl. No.: 11/671,809

(22) Filed: Feb. 6, 2007

(65) Prior Publication Data

US 2008/0188052 A1 Aug. 7, 2008

(51) Int. Cl.
*H01L 21/336* (2006.01)
(52) U.S. Cl. ................ 438/261; 438/267; 257/E21.679
(58) Field of Classification Search ................ 438/260, 438/261, 267; 257/E21.679
See application file for complete search history.

(56) References Cited

U.S. PATENT DOCUMENTS

| 5,338,952 | A | 8/1994 | Yamauchi | 257/315 |
| 6,177,318 | B1 | 1/2001 | Ogura et al. | 438/267 |
| 6,248,633 | B1 * | 6/2001 | Ogura et al. | 438/267 |
| 6,518,619 | B2 | 2/2003 | Verhaar et al. | 257/316 |
| 6,828,618 | B2 | 12/2004 | Baker, Jr. et al. | 257/311 |
| 2005/0085039 | A1 | 4/2005 | Yasui et al. | 438/257 |

* cited by examiner

*Primary Examiner*—Chandra Chaudhari
(74) *Attorney, Agent, or Firm*—Hamilton & Terrile, LLP; Michael Rocco Cannatti

(57) ABSTRACT

A semiconductor process and apparatus are disclosed for forming a split-gate thin film storage NVM device (10) by forming a select gate structure (3) on a first dielectric layer (2) over a substrate (1); forming a control gate structure (6) on a second dielectric layer (5) having embedded nanocrystals (15, 16) so that the control gate (6) is adjacent to the select gate structure (3) but separated therefrom by a gap (8); forming a floating doped region (4) in the substrate (1) below the gap (8) formed between the select gate structure and control gate structure; and forming source/drain regions (11, 12) in the substrate to define a channel region that includes the floating doped region (4).

18 Claims, 6 Drawing Sheets

SPLIT-GATE THIN FILM STORAGE NVM CELL WITH REDUCED LOAD-UP/TRAP-UP EFFECTS

BACKGROUND OF THE INVENTION

1. Field of the Invention

The present invention is directed in general to the field of semiconductor devices. In one aspect, the present invention relates to the fabrication of a split-gate semiconductor device, such as an electrically programmable read-only semiconductor memory device.

2. Description of the Related Art

Nonvolatile memory or storage devices, such as electrically erasable, programmable read-only memories (EE-PROMs), are an important element in the design of electronic devices, such as computers, telecommunications hardware and consumer appliances. A nonvolatile memory (NVM) device is typically constructed with a plurality of cells, each of which is formed as a field effect transistor (FET) which includes a separate charge storage element for storing electrical charge (holes or electrons). For example, a floating-gate NVM cell is characterized by a stacked gate construction in which a floating gate, typically formed from polysilicon, is separated from the substrate by a first (lower) oxide layer and is separated from a polysilicon control gate by a second (upper) oxide layer. No direct electrical connection is made to the floating gate (hence, "floating"). A split-gate NVM cell typically exhibits two distinguishable channel regions, respectively controllable by the floating gate and the control gate, which may or may not be partially overlapping. In whatever configuration is used, data is stored in an NVM cell by modulating the threshold voltage, $V_T$, of the FET through the injection of charge carriers through a dielectric layer and into the charge storage element.

Split-gate NVM cells may advantageously be constructed to include a plurality of nanoclusters (a.k.a. nanocrystals) in the dielectric layer which function to store charge in the dielectric layer. When the control gate is formed before the select gate, the nanoclusters may be formed in the dielectric layer between the control gate and the substrate by (1) growing or depositing a first dielectric layer (e.g., silicon dioxide) over the substrate in the NVM cell channel region, (2) depositing nanocrystals on the first dielectric layer, (3) depositing a second dielectric layer (e.g., silicon dioxide) over the first dielectric layer and nanocrystals and (4) heating the nanocrystals and dielectric layers. When the select gate is formed subsequently (e.g., by forming a third dielectric layer over the control gate and substrate and then forming an etched select gate thereon which is separated from the control gate by the third dielectric layer on the sidewall of the control gate), the resulting split-gate NVM cell structure does not include charge storage nanocrystals in the gap dielectric between the control gate and select gate. However, when the select gate is formed before the control gate (e.g., by forming a gap dielectric layer with nanocrystals over the select gate and substrate and then forming an etched control gate thereon which is separated from the select gate by the gap dielectric layer on the sidewall of the select gate), the resulting split-gate NVM cell structure includes charge storage nanocrystals in the gap between the control gate and select gate, and also in the dielectric layer between the control gate and the substrate.

While there are performance and programming benefits of forming split-gate NVM cells by forming the select gate before control gate first, there are drawbacks associated with the presence of nanocrystals being formed in the gap dielectric between the select gate and control gate or near the control gate corner. For example, load-up effects can be created by the presence of nanocrystals in the gap dielectric, and to some extent, by the presence of any nanocrystal(s) near the control gate corner due to the corner geometry. For example, with a bottom erase (negative gate erase) technology, the load-up effect is caused by the large electric fields which permit electrons to be injected into the corner-region nanocrystals. With top erase (positive gate erase) technology, the corner geometry prevents the gate from removing charge that has accumulated in the corner nanocrystals. In addition, strong corner-region nanocrystal effects may lead to device variation in narrow width devices due to the random nature of nanocrystal formation. In addition to gap nanocrystals effects, trap-up effects may occur in the dielectric near the control gate corner. For example, with a bottom erase technology, a trap-up effect may occur when large electric fields cause electron injection into oxide traps.

Accordingly, a need exists for a semiconductor manufacturing process and apparatus which eliminates or reduces the effects of nanocrystals or oxide traps being formed in the gap dielectric of a split-gate NVM cell. In addition, there is a need for a fabrication process which addresses the load-up, trap-up and or fluctuation effects caused by charging of nanocrystals formed in the gap dielectric of a split-gate device. There is also a need for improved semiconductor processes and devices to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

Figure 1:
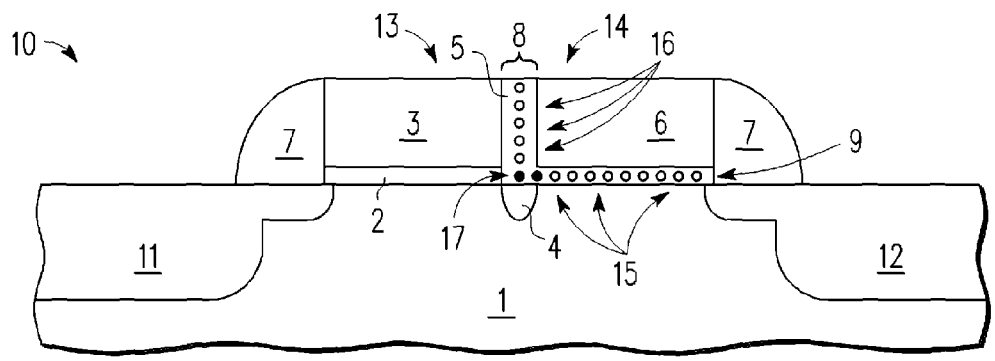
FIG. 1 is a partial cross-sectional view of a split-gate thin film storage non-volatile memory cell having a doped region under the gap between control and select gates.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A method and apparatus are described for fabricating a split-gate thin film storage device which includes a doped region in the substrate below the gap between the control gate and select gate. By forming the doped region as a floating region in the substrate and under the gap between the select and control gates, the influence of charged nanocrystals formed in the gap dielectric between the select and control gates, as well as the influence of charged nanocrystals near the control gate corners, is reduced or eliminated. For example, in the case of electron charge storage, by forming the doped region with n-type dopants/impurities, the influence of the channel nanocrystals (e.g., near the control gate corner or in the gap dielectric) on the voltage threshold $V_t$ is reduced. This is because the charge from the doped region effectively neutralizes the charge stored in the channel nanocrystals. On the other hand, for a given process and operating condition, the preferred approach may be to form the doped region with a smaller concentration of n-type dopants/impurities or with p-type dopants/impurities. With this approach, the device obtains a better programming efficiency and threshold voltage window since the device is more sensitive to the gap nanocrystals near the control gate corner, and therefore more "gap-like." A variety of fabrication processes are disclosed for forming the doped region below the split-gate gap, including using (masked) implantation and/or solid source doping processes that may be used when the select gate is formed first. In addition, fabrication processes are disclosed for forming the doped region below the split-gate gap after the select and control gates are formed, such as by etching the gap dielectric and then implanting the doped region through the remaining gap dielectric, or etching into the substrate between the control gate and select gate to form a trench and then epitaxially growing a doped semiconductor region in the trench, or forming a gap between the select and control gates and then implanting the substrate through the gap to form the doped region in the substrate.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. It is also noted that, throughout this detailed description, certain elements in the figures are illustrated for simplicity and clarity and have not necessarily been drawn to scale. For example, the dimensions of some of the elements in the figures may be exaggerated relative to other elements to help improve the understanding of the embodiments of the present invention.

Turning now to FIG. 1, there is depicted a partial cross-sectional view of a split-gate thin film storage non-volatile memory cell 10 having a doped region 4 under the gap 8 between the select gate 3 and control gate 6. In accordance with selected embodiments where the select gate 3 is formed before the control gate 6, the depicted split-gate NVM device shows a dielectric layer 5 having a first plurality of embedded nanoclusters 15 (in the region 9 between the control gate 6 and substrate 1) and a second plurality of embedded nanoclusters 16 (in the gap dielectric 8 formed between the select gate 3 and control gate 6). Persons skilled in the art sometimes refer to charges stored in the region 9 between the control gate 6 and substrate 1 as nanoclusters, while charge stored in the gap dielectric 8 as gap nanoclusters. Charge stored in oxide traps in the gap dielectric 8 may be referred to as gap fixed charge. However, in accordance with selected embodiments where the control gate 6 is formed before the select gate 3, it will be appreciated that the depicted split-gate NVM device would include only the first plurality of embedded nanoclusters 15 in the region 9 between the control gate 6 and substrate 1. In this case, oxide traps may still be present in dielectric 8.

In the depicted example, the split-gate NVM cell 10 is formed on a substrate 1 which may be a well region of a first conductivity type and concentration overlying another region of a different conductivity type and/or concentration. The depicted NVM cell 10 includes a control gate transistor 14 having at least a control gate electrode 6 formed over a first dielectric layer 5 having an embedded layer of nanoclusters 15, 16 which may be formed with silicon nanocrystals. In addition, the NVM cell 10 includes a select gate transistor 13 having at least a select gate electrode 3 formed over a gate dielectric layer 2. The select gate transistor 13 is separated from the control gate transistor 14 by a first dielectric layer 5 formed in the narrow gap 8, such that source side injection is possible. As explained above, the first dielectric layer 5 formed in the gap 8 may or may not include nanoclusters, depending on the processing sequence used to form the control and select gates. In the gap 8 between the select gate and control gate transistors, the thickness of the first dielectric 5 may be on the order of less than 200 angstroms (<20 nm), and may be formed from a narrow oxide sidewall dielectric. In the substrate 1 below the gap 8, the NVM cell 10 includes a doped or counterdoped region 4 having a predetermined conductivity type and concentration profile. In accordance with selected embodiments of the present invention, the doped region 4 is provided to eliminate or reduce the influence of gap nanocrystals 16 and/or nanocrystals 17 near the control gate corner (indicated in black) and/or gap fixed charge. In other selected embodiments of the present invention, the doped region 4 is provided to increase the influence of gap nanocrystals 16 and/or nanocrystals 17 near the control gate corner. The depicted NVM cell 10 also includes source/drain regions 11, 12 which may be formed in whole or in part by implanting impurities around the implant spacers 7 formed on the sidewalls of the select and control gates. As described herein, the various layers and doped regions of the NVM cell 10, and in particular the doped region 4, can be fabricated using a variety of different fabrication processes.

For example, in accordance with a first illustrative embodiment, the doped region below the split-gate gap may be formed by selectively implanting the substrate using one or more implantation steps. This example sequence is illustrated beginning with FIG. 2 which depicts a partial cross-sectional view of a semiconductor structure 20, including a substrate 21, gate dielectric layer 22 and select gate 23, which are selectively implanted with a first impurity 25 using a mask layer 24 as an implant mask. Depending on the type of device being fabricated, the substrate 21 may be implemented as a bulk silicon substrate, single crystalline silicon (doped or undoped), or any semiconductor material including, for example, Si, SiC, SiGe, SiGeC, Ge, GaAs, InAs, InP as well as other Group III-IV compound semiconductors or any combination thereof, and may optionally be formed as the bulk handling wafer. In addition, the substrate 21 may be implemented as the top silicon layer of a silicon-on-insulator (SOI) structure. As illustrated, the gate dielectric layer 22 is formed by depositing or growing an insulator or high-k dielectric (e.g., nitride, silicon dioxide, oxynitride, metal-oxide, etc.) over the semiconductor substrate 21 using chemical vapor deposition (CVD), plasma-enhanced chemical vapor deposition (PECVD), physical vapor deposition (PVD), atomic layer deposition (ALD), thermal oxidation, or any combination(s) thereof to a thickness of approximately 5-200 Angstroms, though a thinner or thicker layer may also be used.

The select gate 23 may be formed by selectively etching one or more conductive gate stack layers over the gate dielectric layer 22 and substrate 21. In an example embodiment, the select gate 23 is formed by first blanket-depositing a layer of polysilicon or SiGe over the gate dielectric layer 22 by CVD, PECVD, PVD, ALD, or any combination(s) thereof to a thickness of approximately 500-2000 Angstroms, though a thinner or thicker layer may also be used. In addition or in the alternative, the select gate 23 may be formed from or include one or more conductive layers (e.g., metal, silicide or the like), such as a combination of metal and polysilicon layers. The conductive gate stack layer(s) may be anisotropically etched to form the select gate 23, though any desired gate patterning and etch sequence may be used to form the etched select gate 23, including but not limited to photoresist or a hard mask formation, TEOS etch (using the photoresist as a mask), ARC etch (using the remnant TEOS as a mask), pre-etch cleaning, oxide break through, main poly plasma etch, soft landing etch, poly clean overetch, and post-etch cleaning. Though FIG. 2 illustrates a SG-first process, it will be appreciated that a CG-first process may also be used, in which case the select gate 23 is replaced with a control gate.

A mask layer 24 is also formed, either after or as part of the formation of the select gate 23, from a layer of photoresist or a hard mask layer to leave exposed at least part of the substrate 21, if not also the select gate 23. With the mask layer 24 in place, a first doped region 26 is formed in the exposed portion of the substrate by implanting a first impurity 25 around the etched select gate structures 23 using conventional implanting processes to implant ions having a predetermined conductivity type. For example, when the semiconductor device 20 is intended for N channel operation, the first doped region 26 is lightly implanted with arsenic, phosphorus or antimony, though other dopants could be used. When the semiconductor device 20 is intended for P channel operation, the first doped region 26 is implanted with boron, indium or another appropriate dopant. Of course, with CMOS devices, the implantation is controlled to separately implant N and P type devices. The first doped region 26 is shown as being implanted very near the etched select gate structure 23, though a thin sidewall spacer or liner oxide (not shown) may be formed on the etched select gate structure 23 prior to implantation. The implanted ions are subsequently annealed or heated to drive or diffuse the implanted ions into the substrate 21 to form the first doped region 26, though this can be done at a later stage in the fabrication process.

Figure 2:
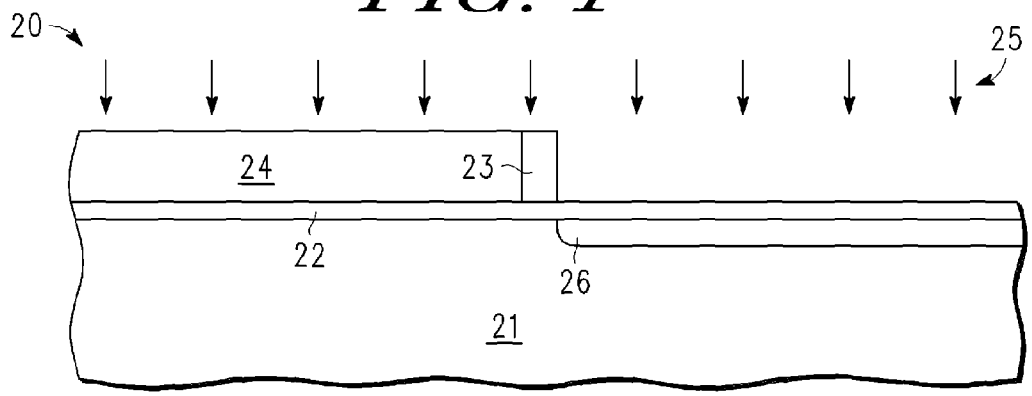
FIG. 2 is a partial cross-sectional view of a semiconductor structure, including a substrate, gate dielectric layer and select gate, which are selectively implanted with a first impurity.
Figure 3:
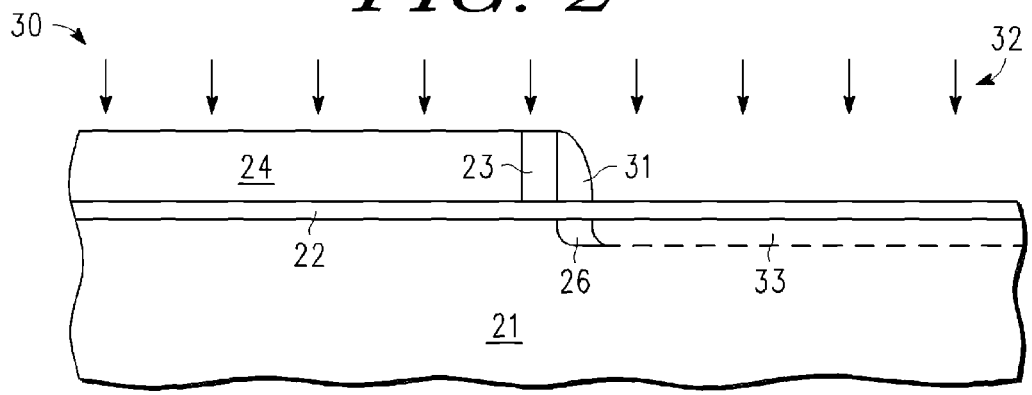
FIG. 3 illustrates processing subsequent to FIG. 2 after a sidewall spacer is formed on the select gate and a second impurity is selectively implanted into the semiconductor structure to form a doped region in the substrate next to the select gate in accordance with a first example embodiment.

FIG. 3 illustrates processing of the semiconductor structure 30 subsequent to FIG. 2 after a sidewall spacer 31 is formed on the select gate 23 and a second impurity 32 is selectively implanted into the semiconductor structure to form a doped region 33 in the substrate 21 next to the select gate 23 in accordance with a first example embodiment. The spacer 31 may be formed by depositing one or more dielectric layers (e.g., over 500 Å of nitride over a thinner spacer liner oxide) using any desired deposition process, and then anisotropically etching the deposited dielectric layer(s) to form the sidewall spacer 31. Depending on the constituent materials and dimensions of the deposited dielectric layer(s), the etching may use one or more anisotropic etch processes to form sidewall spacer 31, including a dry etching process, such as reactive-ion etching, ion beam etching, plasma etching, laser etching, or any combination thereof. In a selected illustrative embodiment, the sidewall spacer 31 is formed by depositing and etching a layer of nitride, where the processing details for the nitride deposition and etching steps are selected to provide a sidewall spacer 31 having a minimum predetermined total spacer width (e.g., approximately 15-25 nm, or more particularly, approximately 20 nm). As illustrated in the figures, the sidewall spacer 31 may be formed on one side of the select gate 23, but it will be appreciated that sidewall spacers may be formed on any one or more or all of the sides of the select gate 23.

With the sidewall spacer(s) 31 in place, a second doped region 33 is formed in the exposed portion of the substrate 21 by implanting a second impurity around the select gate 23 and sidewall spacer structures 31 using any desired implanting processes to implant ions 32 having a predetermined conductivity type for purposes of counterdoping the exposed portions of the previously implanted first implant region 26. For example, to eliminate or reduce the electrical influence of gap/corner nanocrystals when the semiconductor device 30 is intended for N channel operation, the second doped region 33 is lightly implanted with boron, indium, though other dopants could be used. When the semiconductor device 30 is intended for P channel operation, the second doped region 33 is implanted with arsenic, phosphorus, antimony or another appropriate dopant. Again, with CMOS devices, the implantation is controlled to separately implant N and P type devices. Separately or with the first implanted region 26, the implanted ions 33 are subsequently annealed or heated to drive or diffuse the implanted ions into the substrate 21.

Figure 4:
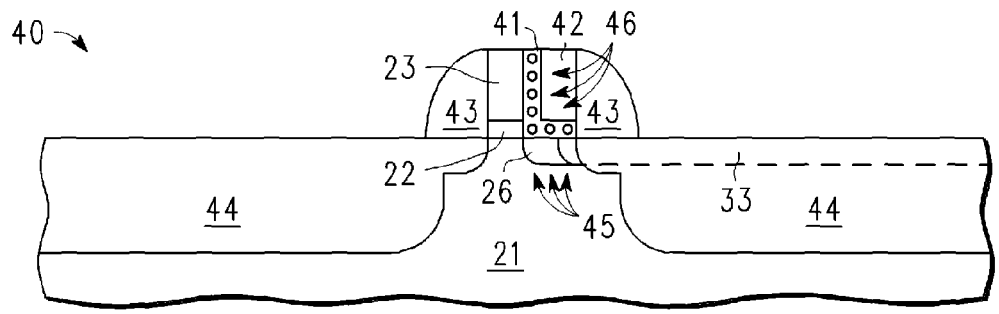
FIG. 4 illustrates processing subsequent to FIG. 3 after a split-gate thin film storage non-volatile memory cell is formed having a doped region under the gap between control and select gates.

FIG. 4 illustrates processing of the semiconductor structure 40 subsequent to FIG. 3 after addition processing steps are used to fabricate a split-gate device (such as a thin film storage non-volatile memory cell) having a doped region 26 under the gap 41 between the select gate 23 and a control gate 42. Once the doped region 26 is formed in the substrate 21 and next to the select gate 23 (where the gap in the split-gate device will be located), any desired sequence of steps can be used to complete the structure 40, including removing the sidewall spacer 31 and mask layer 24; forming a sidewall dielectric layer 41 on at least part of the select gate 23 and over the substrate 21 adjacent to the select gate (e.g., by polishing a deposited or grown dielectric layer); selectively forming a control gate 42 (e.g., by etching and polishing one or more deposited conductive layers); implanting a first shallow portion of the source/drain regions 44 around the etched select and control gates 23, 42; forming one or more sidewall spacers 43 on the sidewalls of the select and control gates 23, 42 (e.g., by anisotropically etching a deposited dielectric layer); and implanting a second deeper portion of the source/drain regions 44 around the sidewall spacers 43. As depicted, the sidewall dielectric layer 41 formed between the control gate 42 and substrate 21 includes a first plurality of embedded nanoclusters 45. In selected embodiments, the sidewall dielectric layer 41 formed between the select gate 23 and control gate 42 also includes a second plurality of embedded nanoclusters 46. By forming the doped region 26 as a floating region in the substrate 21 and under the gap dielectric 41 between the select gate 23 and control gate 42, the influence of charged nanocrystals 46 formed in the gap dielectric between the select and control gates, as well as the influence of charged nanocrystals 45 near the control gate corners, is reduced or eliminated.

In accordance with various embodiments of the present invention, other processing sequences may be used to form a doped region beneath the gap of a split-gate device. For example, a second example embodiment is depicted beginning with FIG. 5, which shows a partial cross-sectional view of a semiconductor structure 50, including a substrate 21, a selectively etched gate dielectric layer 22 and a select gate 23, where a solid source dopant sidewall spacer 51 is formed on the one side of the select gate 23, and (optionally) a mask layer 24 is formed on the other side of the select gate 23. As illustrated, the solid source dopant sidewall spacer 51 is formed in direct contact the substrate 21 by first removing or etching the gate dielectric layer 22 that is not covered by the select gate 23 and mask layer 24, thereby clearing the surface of part of the substrate 21. Subsequently, one or more layers of material doped with a predetermined impurity (for example, an n-type impurity) are deposited and then selectively etched (e.g., with one or more anisotropic etch processes) to form the solid source dopant sidewall spacer 51. In a selected illustrative embodiment, the solid source dopant sidewall spacer 51 is formed by depositing and etching a layer of silicon dioxide, silicon nitride, or other material, which is doped with an n-type dopant, such as phosphorus, arsenic, or antimony, to a concentration of 1e17-1e21 cm$^{-3}$, where the processing details for the deposition and etching steps are selected to provide a solid source dopant sidewall spacer 51 having a minimum predetermined total spacer width (e.g., approximately 15-25 nm, or more particularly, approximately 20 nm).

Figure 5:
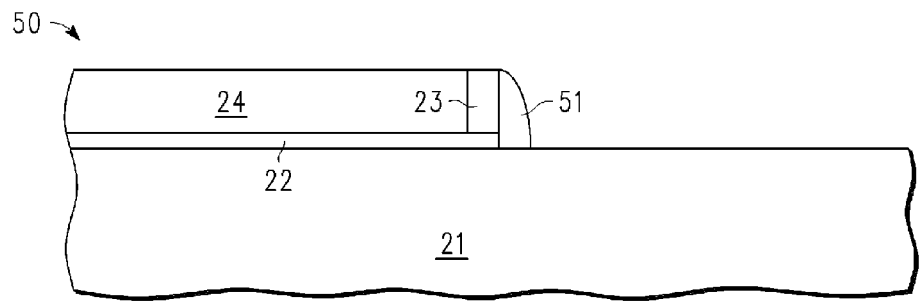
FIG. 5 is a partial cross-sectional view of a semiconductor structure, including a substrate, gate dielectric layer and select gate, after a solid source dopant sidewall spacer is formed on the select gate.
Figure 6:
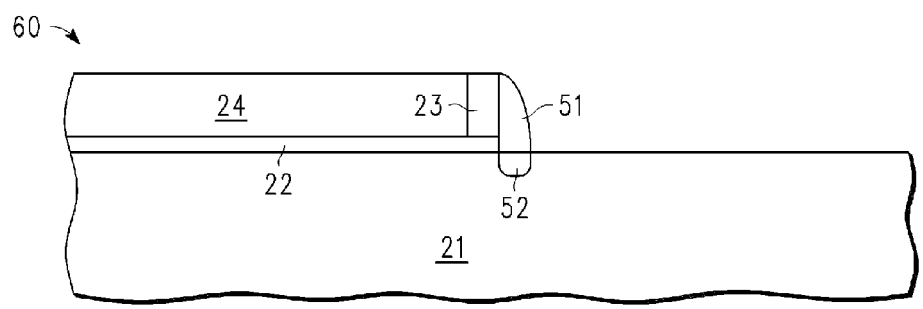
FIG. 6 illustrates processing subsequent to FIG. 5 after an anneal step drives impurities into the semiconductor structure to form a doped region in the substrate next to the select gate in accordance with a second example embodiment.

FIG. 6 illustrates processing of the semiconductor structure 60 subsequent to FIG. 5 after a heat drive or anneal step drives impurities from the solid source dopant sidewall spacer 51 into the semiconductor structure 21 to form a doped region 52 in the substrate next to the select gate 23. Once the doped region 52 is formed in the substrate 21 and next to the select gate 23 (where the gap in the split-gate device will be located), any desired sequence of additional processing steps may be used to complete the fabrication of a split-gate device (such as a thin film storage non-volatile memory cell) having a doped region 52 under the gap between the select and control gates. For example, after removing the solid source dopant sidewall spacer 51 from the sidewalls of the select gate 23, a split-gate device may be fabricated, substantially as depicted in FIG. 4, by removing the mask layer 24; forming a sidewall dielectric layer on at least part of the select gate 23; selectively forming a control gate adjacent the sidewall dielectric layer; and then implanting source/drain regions around the etched select and control gates and/or around one or more sidewall spacers formed on the sidewalls of the select and control gates.

Figure 7:
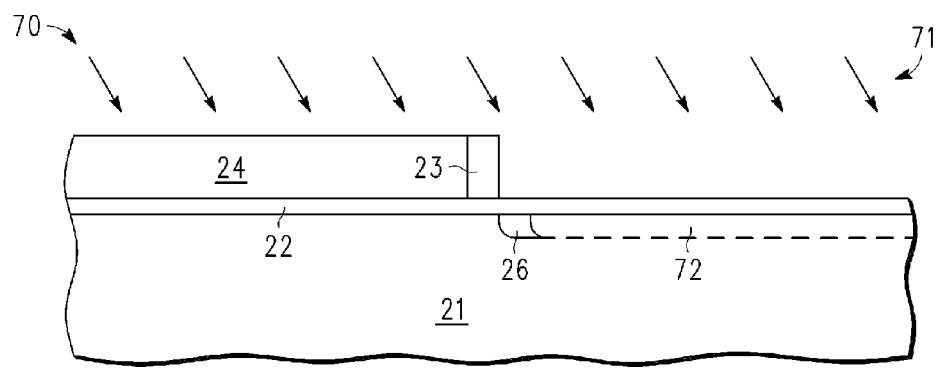
FIG. 7 illustrates processing subsequent to FIG. 2 after a second impurity is selectively implanted at an angle into the semiconductor structure to form a doped region in the substrate next to the select gate in accordance with a third example embodiment.

Yet another example embodiment for forming a doped region beneath the gap of a split-gate device is depicted beginning with FIG. 7, which illustrates processing of the semiconductor structure 70 subsequent to FIG. 2 after a second impurity 71 is selectively implanted at an angle into the semiconductor structure 70 to form a doped region 72 in the substrate 21 next to the select gate 23 in accordance with a third example embodiment. By controlling the angle of the implant, the select gate 23 acts as an implant barrier to effectively "shadow" the implanted impurities 71 from implanting into the substrate 21 immediately adjacent to the select gate 23. With the select gate 23 acting as a mask, the second doped region 72 is formed in the exposed portion of the substrate 21 by implanting a second impurity at an angle using any desired implanting processes to implant ions 71 having a predetermined conductivity type for purposes of counterdoping the exposed portions of the previously implanted first implant region 26. For example, when the semiconductor device 70 is intended for N channel operation, the second doped region 72 is lightly implanted with boron, indium, though other dopants could be used. When the semiconductor device 70 is intended for P channel operation, the second doped region 72 is implanted with arsenic, phosphorus, antimony or another appropriate dopant. Again, with CMOS devices, the implantation is controlled to separately implant N and P type devices. Separately or with the first implanted region 26, the implanted ions 72 are subsequently annealed or heated to drive or diffuse the implanted ions into the substrate 21. As a result of the counterdoping, the remaining doped region 26 is formed in the substrate 21 and next to the select gate 23 (where the gap in the split-gate device will be located), and any desired sequence of additional processing steps may be used to complete the fabrication of a split-gate device (such as a thin film storage non-volatile memory cell) having a doped region 26 under the gap between the select and control gates.

In accordance with other embodiments of the present invention, a doped region beneath the gap of a split-gate device (such as a thin film storage non-volatile memory cell) may be added to a split-gate device after its fabrication is substantially completed. For example, a fourth example embodiment is depicted beginning with FIG. 8, which shows a partial cross-sectional view of a semiconductor structure 80 that is a substantially completed split gate device after formation of source/drain regions 87 around sidewall spacer(s) 86 located on the sides of the control and select gates 83, 85. As depicted, the semiconductor structure 80 includes a split gate (e.g., select gate 83 and control gate 85 that are separated by a dielectric layer 84) formed over a gate dielectric layer 82, where the gate dielectric layer beneath the control gate includes nanocrystals 88 or some other type of local charge storage mechanism. The semiconductor structure 80 also includes one or more source/drain regions 87 formed in the substrate 81. The source/drain regions 87 may be formed by directly implanting impurities around the split gate 83, 85 and/or by implanting impurities around sidewall spacers 86 formed on the split gate 83, 85.

Figure 8:
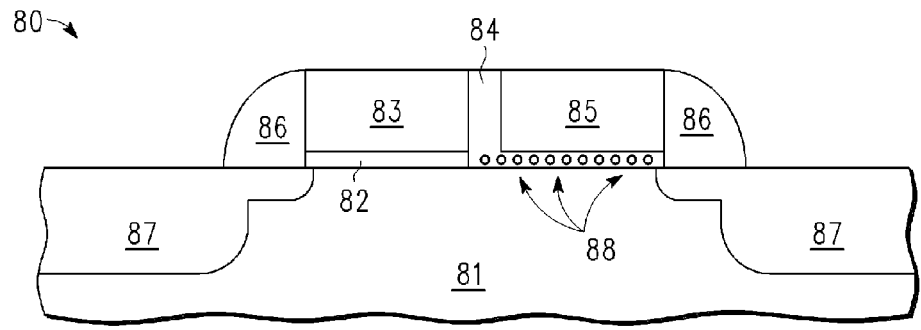
FIG. 8 is a partial cross-sectional view of a split-gate thin film storage structure after formation of source/drain regions around sidewall spacer(s) located on the control and select gates.
Figure 9:
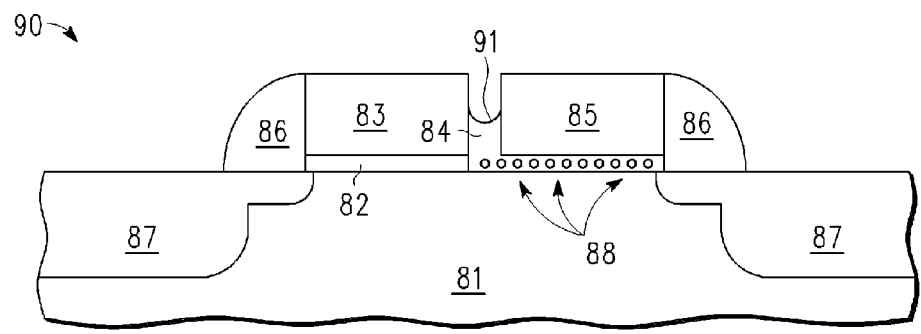
FIG. 9 illustrates processing subsequent to FIG. 8 after a portion of the gap dielectric is removed or etched.

FIG. 9 illustrates processing of the semiconductor structure 90 subsequent to FIG. 8 after a portion of the gap dielectric 84 is removed or etched, thereby forming a recessed gap dielectric with an upper surface 91 that is sufficiently recessed to provide good implant selectivity during the subsequent implant step (described below). While any desired process may be used to selectively remove or etch a portion of the gap dielectric 84, in an example implementation, the gap dielectric 84 may be recessed using a wet etching process, such as a chemical etchant that is selective to the gap dielectric material 84.

Figure 10:
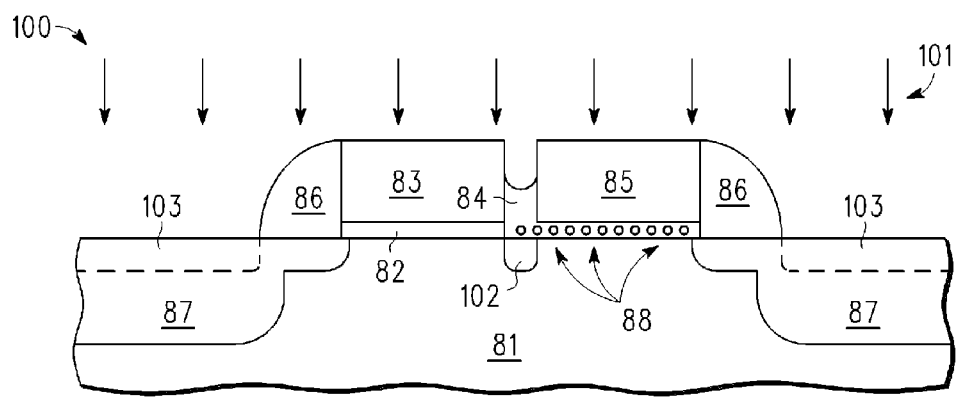
FIG. 10 illustrates processing subsequent to FIG. 9 after an impurity is implanted through the remaining gap dielectric to form a doped region under the gap between control and select gates doped region in the substrate next to the select gate in accordance with a fourth example embodiment.

FIG. 10 illustrates processing of the semiconductor structure 100 subsequent to FIG. 9 after a dopant or impurity 101 is implanted through the remaining gap dielectric 84 to form an implanted region 102 in the substrate 81 and under the gap between select gate 83 and control gate 85. With the split-gate 83, 85 and sidewall spacer(s) 86 in place, the implanted species 101 simultaneously forms implant regions 103 in the exposed portion of the substrate 81. Due to the presence of the remnant gap dielectric layer 84, the depth of the gap implant region 102 will likely be shallower than the depth of the implant regions 103. However, by controlling the implant energy and dosage of the implant step 101, the implant region 102 is formed by effectively counter-doping the channel region below the select gate 83 and control gate 85, while the depth of the implant regions 103 formed in the source/drain regions 87 does not affect the device performance. As will be appreciated, the implanted regions 102, 103 may be annealed separately from, or at the same time as, the annealing of the source/drain regions 87.

In accordance with yet other embodiments of the present invention, a doped region beneath the gap of a split-gate device may be formed after completion of the select gate and control gate, but prior to formation of the source/drain regions. For example, a fifth example embodiment is depicted beginning with FIG. 11, which shows a partial cross-sectional view of a split-gate semiconductor structure 110 having a control gate 113 and select gate 112 separated by a gap dielectric 116 and formed over a substrate 111 and gate dielectric layer 114, where the gate dielectric layer 114 beneath the control gate 113 includes nanocrystals 115 or some other type of local charge storage mechanism. While the split-gate semiconductor structure 110 depicted in FIG. 11 includes a gap dielectric layer 116 formed between the control and select gates, selected embodiments of the present invention may also be implemented by forming the select gate 112 and control gate 113 with a selective etch process that leaves only a gap between the select gate 112 and control gate 113.

Figure 11:
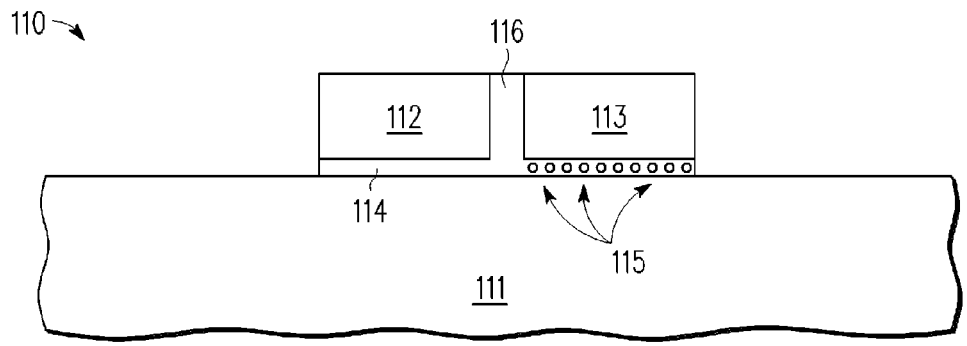
FIG. 11 is a partial cross-sectional view of a split-gate semiconductor structure having a control gate and select gate formed over a substrate and gate dielectric layer.
Figure 12:
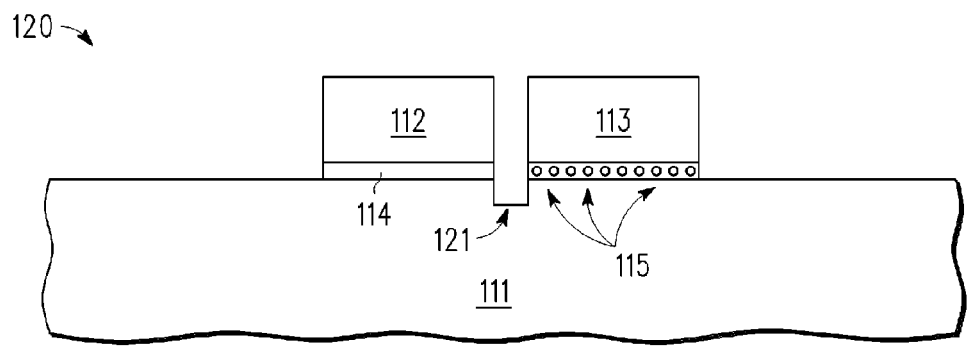
FIG. 12 illustrates processing subsequent to FIG. 11 after a portion of the substrate under the gap between control and select gates is selectively removed or etched.

FIG. 12 illustrates processing of the semiconductor structure 120 subsequent to FIG. 11 after a portion of the substrate 111 under the gap between control and select gates 112, 113 is selectively removed or etched, thereby forming a trench or opening 121 in the substrate 111. When a gap dielectric layer 116 exists between the select and control gates (as depicted in FIG. 11), any desired pattern and etch sequence may be used to form the trench or opening 121. For example, by forming a photoresist or a hard mask layer to leave exposed the split gate structure 112, 113, 116, one or more selective etch steps may be used to remove the gap dielectric layer 116 and to over-etch into the substrate 111 to form the opening 121. Alternatively, if the select gate 112 and control gate 113 are formed with the presence of a gap dielectric layer 116, then a different etch chemistry may be used in combination with an appropriate photoresist or mask layer to etch the trench or opening 121 into the substrate 111.

Figure 13:
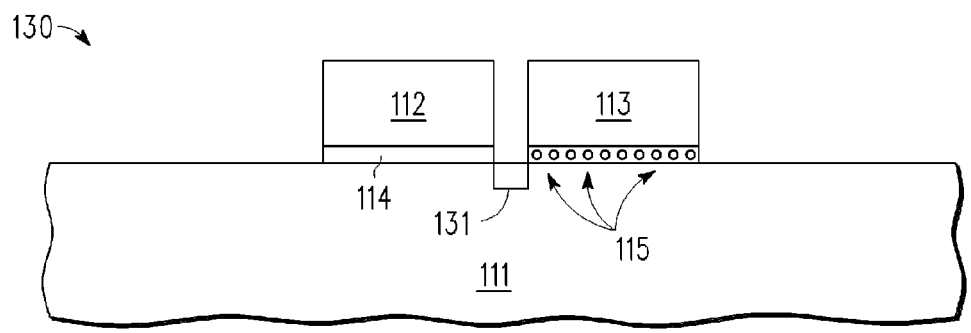
FIG. 13 illustrates processing subsequent to FIG. 12 after a doped region under the gap between control and select gates is formed with a doped epitaxial growth step in accordance with a fifth example embodiment.

Turning now to FIG. 13, processing of the semiconductor structure 130 subsequent to FIG. 12 is illustrated after a doped region 131 under the gap between control and select gates is formed with a doped epitaxial growth step which forms a doped epitaxial silicon layer 131 in the opening 121. As described herein and understood by those skilled in the art, the process of forming an epitaxial layer may be described as either depositing or growing a layer so that the "growth" and "deposition" terms are used interchangeably in this respect, though "growth" is a more descriptive term for epitaxy. Depending on the type of device being fabricated, the doped region 131 may be formed from any doped semiconductor material, such as Si, SiGe, SiC, SiGeC or combinations thereof, which is capable of being formed utilizing a selective epitaxial growth method. This epitaxial growth with in-situ doping may be achieved by heating the semiconductor wafer structure 130 to a temperature between 500 and 900° C. in the presence of dichlorosilane, HCl, hydrogen gas and an appropriate dopant material to provide n-type (electron) and p-type (hole) carriers, depending on the type of device being fabricated. Where a selective epitaxial growth process is used to form the doped region 131, the "selective" nature of the formation process is enhanced when used with control and select gates formed from materials that do not support epitaxial semiconductor growth on their surface(s), such as metal gates. If the control and select gates are formed from polysilicon, then all exposed surfaces of the control and select gates would have to be covered with a thin nitride or oxide layer before the selective epitaxial growth is used to form the doped region 131. Once the doped region 131 is formed in the substrate 111 below the gap between the select gate 112 and control gate 113, any desired sequence of addition processing steps may be used to complete the fabrication of a split-gate device (such as a thin film storage non-volatile memory cell). For example, the gap between the select and control gates may be filled with a dielectric material and then implanting source/drain regions around the etched select and control gates and/or around one or more sidewall spacers formed on the sidewalls of the select and control gates.

Figure 14:
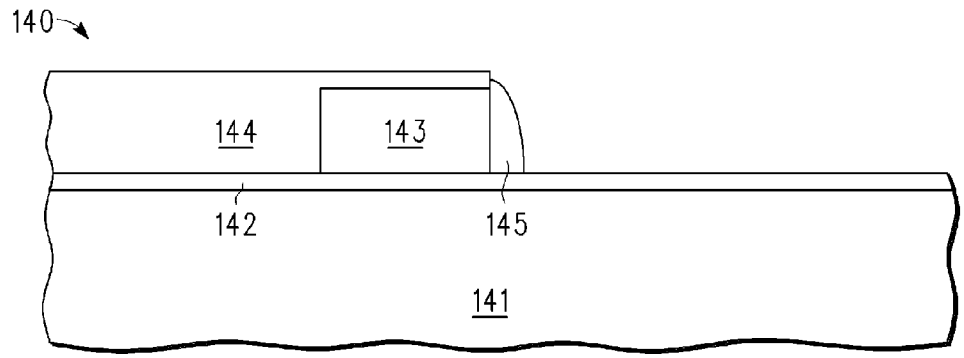
FIG. 14 is a partial cross-sectional view of a semiconductor structure, including a substrate, gate dielectric layer, a select gate having a sidewall nitride spacer.

In accordance with still further embodiments of the present invention, a floating junction region may formed beneath the gap of a split-gate device by implanting through a gap between the select gate and control gate and then oxidizing the nanocrystals in the gap to form a gap dielectric with no nanocrystals. For example, a sixth example embodiment is depicted beginning with FIG. 14, which shows a partial cross-sectional view of a split-gate semiconductor structure 140 having a select gate 143 formed over a substrate 141 and gate dielectric layer 142. As depicted, the select gate 143 is selectively masked with a masking layer 144 that may be formed from one or more dielectric layers (not shown), such as a first nitride layer over the select gate poly and a CVD oxide layer over the first nitride layer and on the sidewall of the select gate 143. As also depicted in FIG. 14, a sidewall spacer 145 is formed on the select gate 143 which will be used to define a gap between the select gate 143 and a subsequently formed control gate. The sidewall spacer 145 may be formed by depositing one or more dielectric layers (e.g., over 500 Å of nitride over a thinner spacer liner oxide) using any desired deposition process, and then anisotropically etching the deposited dielectric layer(s). Depending on the constituent materials and dimensions of the deposited dielectric layer(s), the etching may use one or more anisotropic etch processes to form sidewall spacer 145, including a dry etching process, such as reactive-ion etching, ion beam etching, plasma etching, laser etching, or any combination thereof. In a selected illustrative embodiment, the sidewall spacer 145 is formed by depositing and etching a layer of nitride, where the processing details for the nitride deposition and etching steps are selected to provide a sidewall spacer 145 having a minimum predetermined total spacer width (e.g., approximately 15-25 nm, or more particularly, approximately 20 nm). As illustrated in the figures, the sidewall spacer 145 may be formed on one side of the select gate 143, but it will be appreciated that sidewall spacers may be formed on any one or more or all of the sides of the select gate 143.

Figure 15:
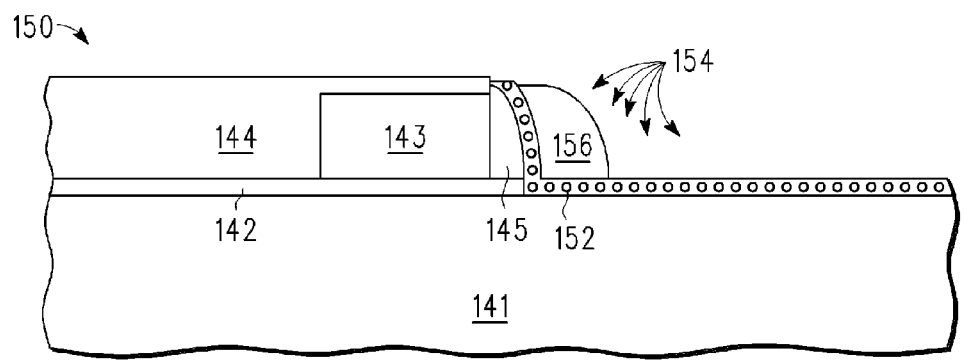
FIG. 15 illustrates processing subsequent to FIG. 14 after a sidewall spacer control gate is formed over a dielectric layer with embedded nanocrystals.

FIG. 15 illustrates processing of the semiconductor structure 150 subsequent to FIG. 14 after a sidewall spacer control gate 156 is formed over a dielectric layer 152 with embedded nanocrystals 154. As a preliminary matter, the dielectric layer 152 with embedded nanocrystals 154 is selectively formed on at least the sidewall of the sidewall nitride spacer 145 and over the substrate 141 where the control gate is subsequently formed. The dielectric layer 152 may be formed in any desired way, including growing or depositing a first dielectric layer (e.g., silicon dioxide) over the substrate 141 in the NVM cell channel region; depositing nanocrystals 154 on the first dielectric layer; and depositing a second dielectric layer (e.g., silicon dioxide) over the first dielectric layer and nanocrystals. Once the dielectric layer 152 is in place, the sidewall spacer control gate 156 may be formed with any suitable process, such as conformally depositing one or more conductive layers (e.g., polysilicon) to a predetermined depth over the semiconductor structure 150 and then anisotropically etching, polishing and/or otherwise selectively removing the deposited conductive layer(s) to form the sidewall spacer control gate 156. As depicted, the etch process used to etch the sidewall spacer control gate 156 may designed with a selective etch chemistry that leaves substantially intact the dielectric materials forming the masking layer(s) 144 and dielectric layer 152.

Figure 16:
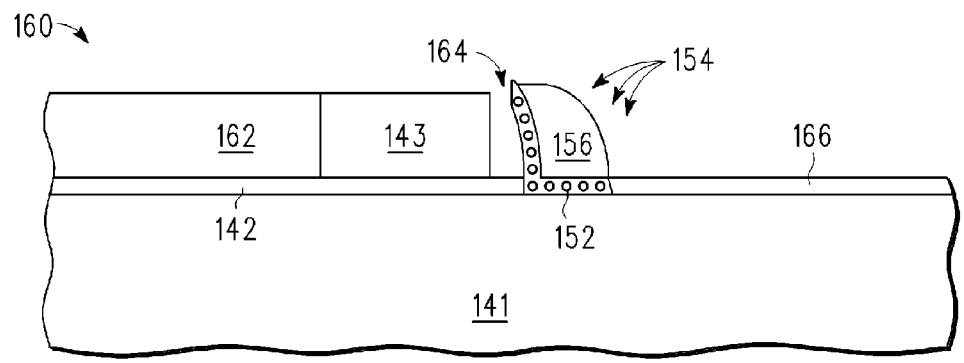
FIG. 16 illustrates processing subsequent to FIG. 15 after the sidewall nitride spacer is selectively removed or etched to form a gap between the select and control gates.

FIG. 16 illustrates processing of the semiconductor structure 160 subsequent to FIG. 15 after the sidewall nitride spacer 145 is selectively removed or etched to form a gap 164 between the select gate 143 and control gate 156. As depicted, the selective etch process used to form the gap 164 may be implemented as a combination of oxide and nitride wet etches to remove the sidewall nitride spacer 145, clear the top of the select gate 143, thin the mask layer 162 and remove the exposed portions of the dielectric layer 152 (which is then regrown as a new oxide layer 166). Of course, other etch processes can be used to form the gap 164, such as using a selective wet etch chemistry that removes any nitride material (such as used to form the sidewall nitride spacer 145 or to cover the select gate 143), but leaves substantially intact any oxide layers (such as used to masking layer(s) 144 and dielectric layer 152). In accordance with selected embodiments, the selective etch process used to form the gap 164 also removes part of the dielectric layer 152, thereby exposing the nanocrystals in the gap. The selective etch process used to form the gap 164 may also clear the surface of the substrate 141 in the area of the gap 164, or at least reduce the thickness of the gate dielectric layer 142 in this area to leave only a thin implant oxide layer.

Figure 17:
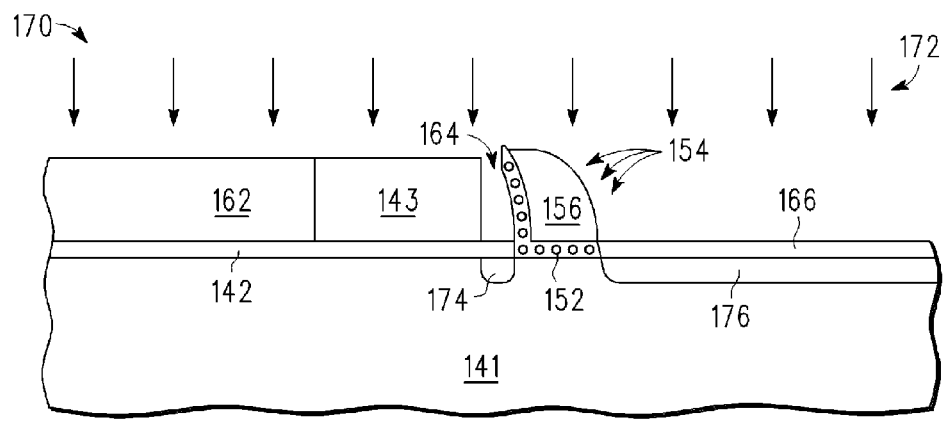
FIG. 17 illustrates processing subsequent to FIG. 16 after an impurity is selectively implanted into the semiconductor structure to form a floating doped region below the gap between the select and control gates in accordance with a sixth example embodiment.

FIG. 17 illustrates processing of the semiconductor structure 170 subsequent to FIG. 16 after a dopant or impurity 172 is selectively implanted into the semiconductor structure to form a floating doped region 174 below the gap 164 between the select and control gates 143, 156. As will be appreciated, the floating doped region 174 may be formed using one or more implantation steps to implant ions having a predetermined conductivity type and concentration. For example, the floating doped region 174 may be formed as a lightly (N−) or heavily (N+) doped region by implanting arsenic, phosphorus or antimony, though other n-type dopants. Alternatively, the floating doped region 174 may be formed as a lightly (P−) or heavily (P+) doped region by implanting boron, indium or other p-type dopants. With the mask layer(s) 162, split-gate 143, 156, and unetched delectric layer 152 in place, the implanted species 172 simultaneously forms implant regions 176 in the exposed portion of the substrate 141 which may be used to form the source/drain regions. As described above, the presence of the floating doped region 174 below the gap between the select and control gates reduces the gap effect (caused by nanocrystals in the gap and/or corner gate region) and improves program efficiency with high read current.

Figure 18:
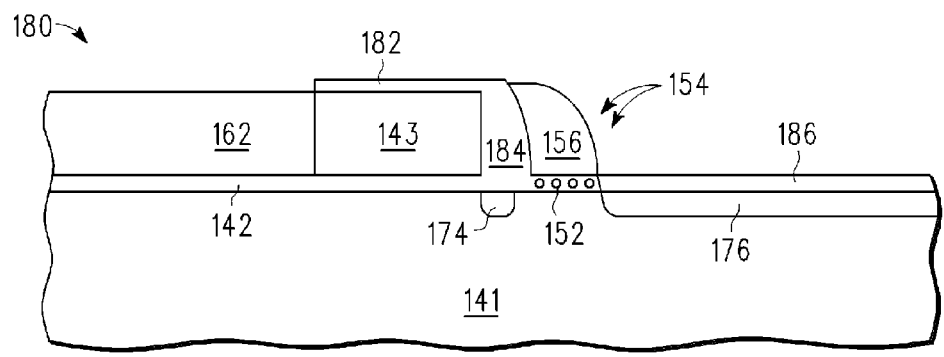
FIG. 18 illustrates processing subsequent to FIG. 17 after the nanocrystals in the gap region are oxidized to form a gate dielectric in the gap.

FIG. 18 illustrates processing of the semiconductor structure 180 subsequent to FIG. 17 after the nanocrystals 154 in the gap region are oxidized to form a gate dielectric 184, leaving the nanocrystals in the dielectric layer 152 between the control gate 156 and substrate 141. In particular, by applying a thermal oxidation process, an oxide layer 182 is formed to fill the gap between the select and control gates. As a result of the oxidation process, the oxide layer 182 includes a first region 184 that is formed in part by oxidizing the gap nanocrystals 154 (such as those in the vertical portion of the gate dielectric layer shown in FIG. 17). The oxidation process also forms the oxide layer 182 by oxidizing the exposed portions of the select gate (e.g., the top surface and side surface in the gap), and may also thicken the oxide layer 186 formed over the exposed portion of the substrate 141. Although it is not always necessary to use the thermal oxidation process to oxidize gap nanocrystals, it can be used to fabricate split-gate devices having a gap region without nanocrystals, thereby allowing cells to be programmed efficiently using source side injection, decreasing charge trap-up effects and improving gap breakdown voltage without losing cell current. In addition, when the process is used to form split-gate devices having a relatively thick gap dielectric without nanocrystals, the gap breakdown voltage is increased and charge load-up effects from the gap nanocrystals are reduced or eliminated. In other embodiments, an oxide deposition process can be used to fill the gap between the select and control gates.

It will be appreciated that additional processing steps will be used to complete the fabrication of the semiconductor structures into functioning split-gate devices. As examples, one or more sacrificial oxide formation, stripping, isolation region formation, extension implant, halo implant, spacer formation, source/drain implant, heat drive or anneal steps, and polishing steps may be performed, along with conventional backend processing (not depicted) typically including formation of multiple levels of interconnect that are used to connect the transistors in a desired manner to achieve the desired functionality. Thus, the specific sequence of steps used to complete the fabrication of the split-gate devices may vary, depending on the process and/or design requirements.

By now it should be appreciated that there has been provided a method for making a semiconductor device, such as a split-gate thin film storage NVM device, by forming a floating doped region in the substrate below the gap separating a select gate from control gate. Under the method, a first gate structure is formed on a first dielectric layer over a substrate, and a second gate structure is formed on a second dielectric layer having a plurality of nanocrystals so that the second gate structure is adjacent to the first gate structure, but separated from the first gate structure by a gap formed between the first gate structure and second gate structure. As will be appreciated, the first gate structure can be the select gate, while the second gate structure can be the control gate, or vice versa. With the select gate and control gate structures in place (or as part of the process of forming the select gate and control gate structures), a floating doped region is formed in the substrate below the gap formed between the select gate structure and control gate structure. In addition, source/drain regions are formed in the substrate adjacent to the select gate structure and control gate structure to define a channel region that includes the floating doped region. In a first example embodiment, the floating doped region is formed by implanting ions of a first conductivity type around the select gate structure to form a first implant region in the substrate that is adjacent to the select gate structure; forming a sidewall spacer on the select gate structure to mask a first portion of the first implant region that is adjacent to the select gate structure; and implanting ions of a second opposite conductivity type around the spacer structure and into the first implant region before the control gate structure is formed, thereby forming the floating doped region from the first portion of the first implant region that has not been implanted with the ions of the second opposite conductivity type. As will be appreciated, the sequence from this example could also be used when the control gate is formed first.

In a second example embodiment, the floating doped region is formed by using a vertical implant process to selectively implant ions of a first conductivity type around the select gate structure to form a first implant region in the substrate that is adjacent to the select gate structure; and then using an angled implant process to selectively implant ions of a second opposite conductivity type around the select gate structure and into the first implant region before the control gate structure is formed, where the select gate structure masks a first portion of the first implant region that is adjacent to the select gate structure, thereby forming the floating doped region from the first portion of the first implant region that has not been implanted with the ions of the second opposite conductivity type. Again, the sequence from this example could also be used when the control gate is formed first.

In a third example embodiment, the floating doped region is formed by forming a solid source spacer structure having dopants of a predetermined conductivity type on a sidewall of the select gate structure and in contact with the substrate area adjacent to the select gate structure; and then annealing the solid source spacer structure to drive dopants from the solid source spacer structure into the substrate before the control gate structure is formed, thereby forming the floating doped region in the substrate adjacent to the select gate structure. As noted above, the sequence from this example could also be used when the control gate is formed before the select gate.

In a fourth example embodiment, the floating doped region is formed by first removing a portion of a gap dielectric layer formed in the gap that separates the select gate structure and control gate to leave a remnant dielectric layer in the gap while leaving the select gate structure and control gate structure substantially intact; and then implanting ions of a first conductivity type through the remnant dielectric layer in the gap, thereby forming the floating doped region in the substrate below the gap. In this example sequence, it does not matter whether the control gate or select gate is formed first.

In a fifth example embodiment, the floating doped region is formed by selectively removing a portion of the substrate below the gap that separates the select gate structure and control gate structure to form an opening in the substrate below the gap; and then epitaxially growing a doped semiconductor region in the opening to form the floating doped region in the substrate below the gap. Again, it does not matter whether the control gate or select gate is formed first.

In a sixth example embodiment, the control gate structure is formed by first forming a sidewall spacer structure on the select gate structure to define a first portion of the substrate below the first spacer structure; forming a charge storage dielectric layer having a plurality of nanocrystals over the first spacer structure and substrate; depositing a polysilicon layer over the charge storage dielectric layer; and anisotropically etching the polysilicon layer to form the control gate structure that is adjacent to the select gate structure but separated therefrom by a gap containing the spacer structure and a portion of the charge storage dielectric layer. With this control gate structure in place, the spacer structure is selectively removed to form an opening between the select gate structure and control gate structure and over the first portion; and ions of a first conductivity type are implanted through the opening and into the first portion of the substrate, thereby forming the floating doped region in the substrate below the gap. The opening may be filled by growing a dielectric layer that is formed at least in part by oxidizing nanocrystals in the charge storage dielectric layer that are located in the gap formed between the select gate structure and control gate structure. Again, the sequence from this example could also be used when the control gate is formed first.

In another form, there is provided a non-volatile memory cell having a split-gate structure formed over a semiconductor substrate. In the semiconductor substrate, source and drain regions are formed to define a substrate channel region therebetween. Over part of the substrate channel region, a select gate structure and first dielectric layer are formed. In addition, a control gate structure and second dielectric layer are formed over the substrate channel region such that the control gate structure is adjacent to the select gate structure and separated therefrom by a gap dielectric layer formed between the control gate structure and select gate structure. In various embodiments, charge storage nanoclusters are embedded in the second dielectric layer and/or the gap dielectric layer. Below the gap dielectric layer and in the channel substrate, a floating doped region is formed to reduce the electrical influence (such as threshold voltage effects) of gap nanocrystals formed in the second dielectric layer and/or the gap dielectric layer.

In yet another form, there is provided a method for forming a semiconductor non-volatile memory device. In the disclosed method, the mea split-gate structure is formed over a dielectric layer formed on a semiconductor substrate. As formed, the split-gate structure includes a select gate structure and an adjacent control gate structure that is separated from the select gate structure by a gap in which is subsequently formed a gap dielectric layer. During formation of the split-gate structure, a floating doped region is formed in the semiconductor substrate below the gap. For example, the control gate structure can be formed before the floating doped region and select gate structure. Alternatively, the select gate structure can be formed before the floating doped region and the control gate structure. In yet another alternative, the select gate structure and control gate structure can be formed before the floating doped region. However formed, the floating doped region reduces electrical influence of gap nanocrystals formed in the gap or in the dielectric layer. After formation of the split-gate structure, a source/drain region is formed in the semiconductor substrate on first and second sides of the split-gate structure.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the depicted split-gate structures may be formed in a well region (not shown) of the substrate which may be an n-doped well or a p-doped well. Also, the various silicon-based constituent layers may be formed with different conductive materials than those disclosed. In addition, the source and drains and extensions may be p-type or n-type, depending on the polarity of the underlying substrate or well region, in order to form either p-type or n-type semiconductor devices. Moreover, the thickness of the described layers may deviate from the disclosed thickness values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor device comprising:
    forming a first gate structure on a first dielectric layer over a substrate;
    forming a second gate structure on a second dielectric layer over the substrate so that the second gate structure is adjacent to the first gate structure but separated from the first gate structure by a gap formed between the first gate structure and second gate structure, where the second dielectric layer comprises a plurality of nanocrystals;
    forming a floating doped region in the substrate below the gap formed between the first gate structure and second gate structure; and
    forming first and second source/drain regions in the substrate adjacent to the first gate structure and second gate structure, said first and second source/drain regions defining a channel region that includes the floating doped region.

2. The method of claim 1, where forming a floating doped region comprises:
    implanting ions having a first predetermined conductivity type around the first gate structure before the second gate structure is formed, thereby forming a first implant region in the substrate that is adjacent to the first gate structure;
    forming a first spacer structure on a sidewall of the first gate structure to mask a first portion of the first implant region that is adjacent to the first gate structure; and
    implanting ions having a second opposite conductivity type around the first spacer structure and into the first implant region before the second gate structure is formed, thereby forming the floating doped region from the first portion of the first implant region that has not been implanted with the ions having the second opposite conductivity type.

3. The method of claim 1, where forming a floating doped region comprises:
    using a vertical implant process to selectively implant ions having a first predetermined conductivity type around the first gate structure before the second gate structure is formed, thereby forming a first implant region in the substrate that is adjacent to the first gate structure;
    using an angled implant process to selectively implant ions having a second opposite conductivity type around the first gate structure and into the first implant region before the second gate structure is formed, where the first gate structure masks a first portion of the first implant region that is adjacent to the first gate structure, thereby forming the floating doped region from the first portion of the first implant region that has not been implanted with the ions having the second opposite conductivity type.

4. The method of claim 1, where forming a floating doped region comprises:
    forming a solid source spacer structure on a sidewall of the first gate structure and in contact with the substrate area adjacent to the first gate structure before the second gate structure is formed, where the solid source spacer structure comprises dopants of a predetermined conductivity type;
    annealing the solid source spacer structure to drive dopants from the solid source spacer structure into the substrate before the second gate structure is formed, thereby forming the floating doped region in the substrate adjacent to the first gate structure.

5. The method of claim 1, where forming a floating doped region comprises:
    removing a portion of a gap dielectric layer formed in the gap that separates the first gate structure and second gate structure, thereby forming a remnant dielectric layer in the gap while leaving the first gate structure and second gate structure substantially intact; and
    implanting ions having a first predetermined conductivity type through the remnant dielectric layer in the gap, thereby forming the floating doped region in the substrate below the gap formed between the first gate structure and second gate structure.

6. The method of claim 1, where forming a floating doped region comprises:

selectively removing a portion of the substrate below the gap that separates the first gate structure and second gate structure while leaving the first gate structure and second gate structure substantially intact, thereby forming an opening in the substrate below the gap; and epitaxially growing a doped semiconductor region selectively in the opening while not growing on the select and second gate structures, thereby forming the floating doped region in the substrate below the gap formed between the first gate structure and second gate structure.

7. The method of claim 1, where forming a second gate structure comprises:

forming a first spacer structure on a sidewall of the first gate structure before the second gate structure is formed, thereby defining a first portion of the substrate below the first spacer structure;

forming a second dielectric layer comprising a plurality of nanocrystals over the first spacer structure and substrate;

depositing a polysilicon layer over the second dielectric layer; and anisotropically etching the polysilicon layer to form the second gate structure that is adjacent to the first gate structure but separated from the first gate structure by a gap formed between the first gate structure and second gate structure and containing the first spacer structure and a portion of the second dielectric layer.

8. The method of claim 7, where forming a floating doped region comprises:

selectively removing the first spacer structure to form an opening between the first gate structure and second gate structure and over the first portion of the substrate while leaving the first gate structure and second gate structure substantially intact; and implanting ions having a first predetermined conductivity type through the opening and into the first portion of the substrate, thereby forming the floating doped region in the substrate below the gap formed between the first gate structure and second gate structure.

9. The method of claim 8, further comprising growing a dielectric layer to fill the opening at least in part by oxidizing nanocrystals in the second dielectric layer that are located in the gap formed between the first gate structure and second gate structure.

10. A method for forming a semiconductor non-volatile memory device, comprising:

forming a split-gate structure over a dielectric layer formed on a semiconductor substrate, where the split-gate structure comprises a select gate structure and an adjacent control gate structure that is separated from the select gate structure by a gap;

forming a floating doped region in the semiconductor substrate below the gap during formation of the split-gate structure; and forming a source/drain region in the semiconductor substrate on first and second sides of the split-gate structure.

11. The method of claim 10, where the floating doped region reduces electrical influence of gap nanocrystals formed in the gap or in the dielectric layer.

12. The method of claim 10, where forming a split-gate structure comprises forming the control gate structure before forming the floating doped region and select gate structure.

13. The method of claim 10, where forming a split-gate structure comprises forming the select gate structure before forming the floating doped region and the control gate structure.

14. The method of claim 10, where forming a split-gate structure comprises forming the select gate structure and control gate structure before forming the floating doped region.

15. A method for forming a semiconductor non-volatile memory device, comprising:

forming a split-gate structure over a dielectric layer formed on a semiconductor substrate, where the split-gate structure comprises a select gate structure and an adjacent control gate structure that is separated from the select gate structure by a gap;

forming a floating doped region in the semiconductor substrate below the gap which reduces electrical influence in the semiconductor substrate of nanocrystals formed in the gap relative to nanocrystals formed in the dielectric layer under the control gate structure; and forming a source/drain region in the semiconductor substrate on first and second sides of the split-gate structure.

16. The method of claim 15, where forming a split-gate structure comprises forming the control gate structure before forming the floating doped region and select gate structure.

17. The method of claim 15, where forming a split-gate structure comprises forming the select gate structure before forming the floating doped region and the control gate structure.

18. The method of claim 15, where forming a split-gate structure comprises forming the select gate structure and control gate structure before forming the floating doped region.

* * * * *